United States Patent [19]

Statt et al.

[11] Patent Number: 4,633,092
[45] Date of Patent: Dec. 30, 1986

[54] LIGHT SENSING DEVICE

[75] Inventors: David J. Statt; Badhri Narayan; Peter M. Zeitzoff, all of Rochester, N.Y.

[73] Assignee: Eastman Kodak Company, Rochester, N.Y.

[21] Appl. No.: 670,720

[22] Filed: Nov. 13, 1984

[51] Int. Cl.$^4$ ............................................. H01J 40/14
[52] U.S. Cl. .................................. 250/578; 250/211 J; 357/30
[58] Field of Search ............... 250/211 J, 578; 357/13, 357/24 LR, 30

[56] References Cited

U.S. PATENT DOCUMENTS

| | | | |
|---|---|---|---|
| 3,064,167 | 11/1962 | Hoerni | 317/324 |
| 3,434,015 | 3/1969 | Kilby | 317/101 |
| 3,772,517 | 11/1973 | Smith | 250/209 |
| 3,945,732 | 3/1976 | Nobusawa | 356/222 |
| 4,271,420 | 6/1981 | Chikamura et al. | 357/30 |
| 4,285,583 | 8/1981 | Canter | 354/23 |
| 4,407,010 | 9/1983 | Baji et al. | 350/211 J X |
| 4,420,773 | 12/1983 | Toyoda et al. | 358/335 |

FOREIGN PATENT DOCUMENTS

| | | |
|---|---|---|
| 0033230 | 8/1981 | European Pat. Off. |
| 0066767 | 12/1982 | European Pat. Off. |
| 0102169 | 8/1981 | Japan |
| 2044996 | 10/1980 | United Kingdom |

Primary Examiner—Eugene R. Laroche
Assistant Examiner—James C. Lee
Attorney, Agent, or Firm—Dennis P. Monteith

[57] ABSTRACT

A light sensing device comprises a photoconductive layer overlaying an array of PN junction diodes integrated within a semiconductor substrate. When a voltage is applied to the device to reverse bias the diodes, the voltage divides across the device in accordance with the capacitance of capacitive elements formed by the photoconductive layer and the junction capacitance of the diodes. When light impinges on the device, charge transfers from the photoconductive layer and accumulates at the underlying junctions at a rate that is directly dependent on the intensity of light incident on the corresponding portion of the photoconductive layer. When a diode reverse breakdown voltage is reached, the corresponding diode conducts. This causes an increase in current through the device, thereby signaling that a desired localized exposure has been attained.

5 Claims, 6 Drawing Figures

4,633,092

LIGHT SENSING DEVICE

CROSS-REFERENCE TO RELATED APPLICATION

Reference is hereby made to U.S. patent application Ser. No. 670,719 entitled a SOLID STATE LIGHT SENSING DEVICE by Peter Zeitzoff, filed on even date herewith.

BACKGROUND OF THE INVENTION

1. Field of the Invention

This invention relates to a light sensing device. More specifically, the invention relates to a light sensing device that is sensitive to localized light intensity conditions.

2. Description Relative to the Prior Art

It is known in the art to use a photosensitive device for determining the exposure interval of a scene being photographed. Typically, such a device includes a photocell that produces an electrical output in response to the average intensity of reflected scene light, and additional circuitry to integrate the electrical output over a given time period.

While the above-described device serves its intended purpose, it is limited to measuring the average intensity of reflected scene light. When an exposure is controlled according to average scene elements which are arranged to respond to light reflected from localized or different portions of a scene. The photocells are used to detect portions of a scene having maximum or minimum brightness. Devices of this type are relatively complex, however, as they use additional circuitry to integrate the output of each photosensitive element. Furthermore, a device which utilizes discrete photoconductive elements is limited in resolution and therefore is restricted in ability to distinguish light reflected from one portion of a scene from light reflected from other portions of a scene.

SUMMARY OF THE INVENTION

In view of the foregoing, an object of the invention is to provide a light sensing device of simple design and compact unitary structure for detecting localized exposure conditions with high resolution.

The object of the invention is achieved by a light sensing device comprising a photoconductive layer overlaying an array of PN junction diodes integrated within a semiconductor substrate. When an electrical potential is applied across the light sensing device to reverse bias the diodes, the applied voltage divides between the photoconductive layer and the semiconductor substrate in accordance with the capacitance of an array of capacitive elements formed by the photoconductive layer and the junction capacitance of the array of corresponding diodes. When light impinges on the device, charge is transferred from the photoconductive layer to the underlying PN junctions at a rate that is directly dependent on the localized intensity of impinging light. When a PN junction accumulates sufficient charge to produce a junction voltage that is equal to the diode's reverse breakdown voltage, the corresponding diode turns on. This causes an increase in current through the light sensing device, thereby indicating that a desired localized exposure has occurred.

The invention and its other advantages will become more apparent in the detailed description of a preferred embodiment presented below.

BRIEF DESCRIPTION OF DRAWINGS

In the detailed description of a preferred embodiment, reference is made to the accompanying drawings, in which.

DETAILED DESCRIPTION OF PREFERRED EMBODIMENTS

Figure 1:
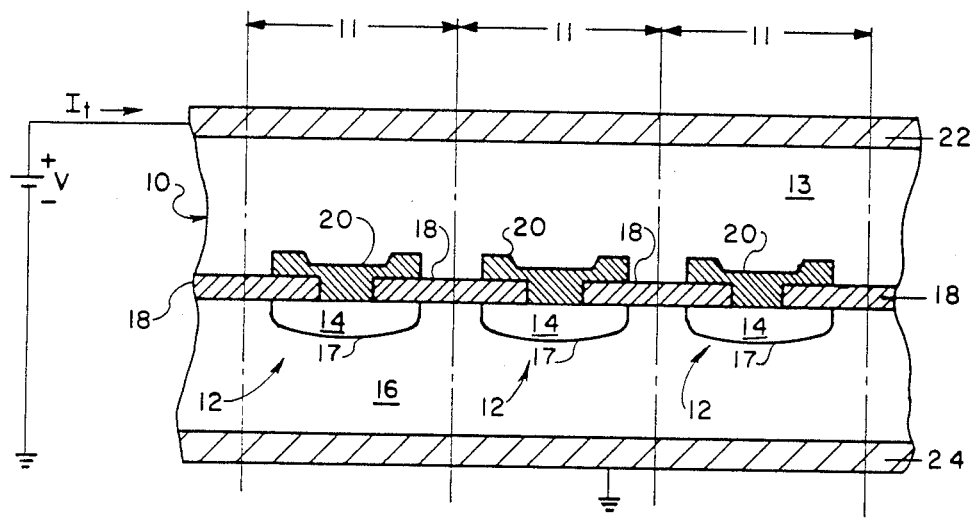
FIG. 1 is a simplified cross-sectional view of a light sensing device showing three light sensing elements of the device.

A light sensing device 10 in accordance with the invention comprises one or more light sensing elements 11 each of which is arranged to receive light reflected from localized portions of a scene. FIG. 1 of the drawings shows three of the elements 11 arranged in a row, but it will be understood that the elements 11 preferably are arranged in rows and columns, to form an area array of light sensing elements.

Each element 11 comprises a diode 12 over which is formed a layer of photoconductive material 13. In the disclosed embodiment, each diode 12 comprises an N-type region 14 diffused in the top surface of a P-type semiconductive substrate 16, such as silicon. A PN junction 17 of each diode 12 extends to the top surface of the substrate 16. U.S. Pat. No. 3,064,167 discloses the fabrication of a diffused junction diode in a semiconductive substrate.

It is known in the art that the depth and area of a PN junction and the concentration levels of the N-type and P-type impurities determine the reverse breakdown voltage characteristics of a junction diode and the capacitance of the junction. For example, U.S. Pat. No. 3,434,015 discloses the relationship between junction capacitance and junction area.

During the diffusion of N-type impurities into the substrate 16, there is normally produced an insulating layer 18 of oxide of the substrate 16. Portions of the layer 18 are removed by conventional photolithography and etching techniques to expose each N-type region 14, with the corresponding PN junction 17 and the top surface of the substrate 16 still being covered by the insulating layer 18. An ohmic contact 20, such as aluminum, is deposited on the exposed upper surface of each region 14, to form a series of electrically conductive terminals, each of which serially connects an N-type region 14 of a diode 12 with the photoconductive layer 13. As shown in FIG. 1, the layer 18 insulates the photoconductive layer 13 from the junctions 17 and the substrate 16, and insulates the contacts 20 from the P-regions of the substrate 16.

A transparent conductor 22 is formed over the photoconductive layer 13 and a metal layer 24 is formed on the back side of the substrate 16, to provide electrical contacts for the application of an electrical potential across the device 10. Additionally, the combination of the conductor 22, the photoconductive layer 13 and the series of contacts 20 form an array of capacitive elements, each of which is serially connected to an underlying diode 12.

Figure 2:
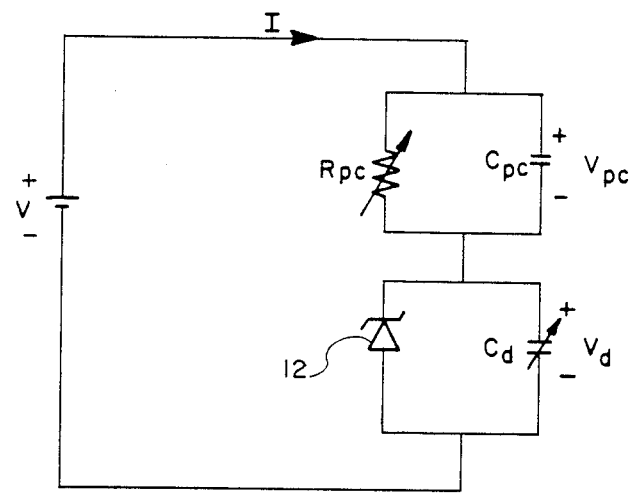
FIG. 2 is an equivalent circuit of one element of the light sensing device of FIG. 1.

An equivalent circuit for an element 11 of the device 10 is shown in FIG. 2. $R_{pc}$ is the resistance of the photoconductive layer 13 associated with each element 11. As is known in the art, $R_{pc}$ varies inversely with the intensity of light impinging on the layer 13. Accordingly, $R_{pc}$ varies laterally across the photoconductive layer 13 in accordance with the intensity of localized light impinging on the photoconductor.

$C_{pc}$ is the capacitance of each capacitive element connected to a diode 12. As is also well known in the art, $C_{pc}$ is a function of the width of the photoconductive layer 13 and its dielectric constant, and the area of the contacts 20.

$C_d$ is the diode junction capacitance. As disclosed in further detail in the aforementioned U.S. Pat. No. 3,434,015, $C_d$ is related to the area of the junction 17 and the width of its charge depletion region, which is a function of the doping profile and of the voltage applied across the junction. The reverse breakdown voltage of the diode 12 is related to the depth of the junction 17, and to the concentration level of P-type impurities in the substrate 16.

$V_{pc}$ and $V_d$ are the respective voltages across the photoconductive layer 13 and corresponding diode 12 when an electrical potential V is applied across the device 10.

When light is prevented from impinging on the device 10 (for example, by a closed shutter in an associated photographic camera), the magnitude of the resistanc $R_{pc}$ is very high. In this condition, potential V is connected across the device 10 to reverse bias the diodes 12, charge accumulates at each PN junction 17 and the corresponding portion of the photoconductive layer 13. The applied voltage V divides in accordance with the capacitance of the PN junction 17 and the capacitance of the corresponding capacitive element formed by the photoconductive layer 13, as follows:

$$V_{pc} = \frac{C_d V}{C_d + C_{pc}}$$

$$V_d = \frac{C_{pc} V}{C_d + C_{pc}}$$

Figure 3:
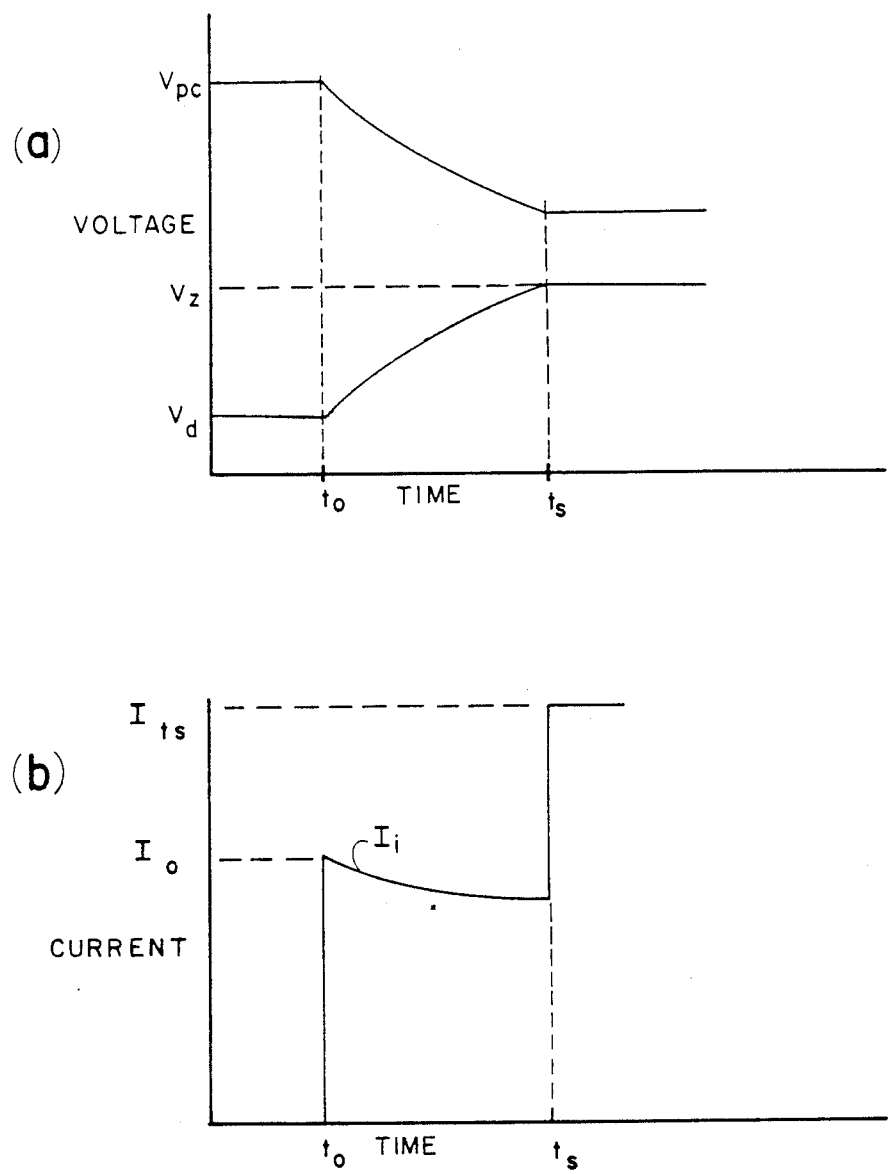
FIGS. 3(a) and 3(b) show respectively voltage and current waveforms for one element of the light sensing device.

In a preferred embodiment of the invention, the device 10 is fabricated so that the junction capacitance of each diode 12 is higher than the capacitance of its corresponding capacitive element. Thus, the voltage V divides across the device 10 so that the voltage across the photoconductive layer 13 is greater than the voltage across the corresponding diode 12. Furthermore, in accordance with the invention, the capacitances are selected so that when the voltage V is applied with a polarity to reverse bias the diodes 12, the voltage across each diode is less than the aforementioned diode reverse breakdown voltage. Thus, as shown in FIG. 3(a), prior to the time light first impinges on the device 10, i.e. $t_o$, the voltage $V_d$ across a diode 12 is less than the voltage $V_{pc}$, and $V_d$ is less than the diode reverse breakdown voltage, denoted $V_z$.

The device 10 is operated by imaging an external scene or other optical input onto the transparent conductor 22. FIGS. 3(a) and 3(b) depict the resulting voltage and current for a typical element 11.

At time $t_o$, when light is first incident on an element 11 (for example, by the opening of a shutter in an associated camera not shown), $R_{pc}$ decreases rapidly from a very high dark resistance value to a value corresponding to the localized light intensity. Capacitor $C_{pc}$ then begins to discharge through $R_{pc}$. The rate of change of $V_{pc}$ through $R_{pc}$ is inversely dependent on $R_{pc}$, and, therefore, is directly dependent on the intensity of impinging light. The net current I to the element 11 causes charge to accumulate at the PN junction 17. Thus, the capacitor $C_d$ charges, which causes $V_d$ to increase at the rate at which $V_{pc}$ decreases. When $V_d$ equals the reverse breakdown voltage, $V_z$, of the diode 12, i.e. at time $t_s$, the diode switches immediately from an off to an on state. $V_d$ is therefore clamped at $V_z$ and the voltage across the photoconductor 13 is clamped at V-$V_z$. This causes the current through the device 10 to increase sharply to a steady state value $I_{ts}$, as shown in FIG. 3b.

The time interval $t_s$-$t_o$, and the rate at which $V_d$ increases are functionally related to the magnitude of the resistance $R_{pc}$ of the photoconductive layer 13. For the case when the intensity of light incident on an element 11 is lower, the value of $R_{pc}$ is correspondingly greater. Therefor, $V_d$ increases more slowly and the interval $t_s$-$t_o$ is longer.

For a given device 10 and a given value of V, a desired amount of exposure light, i.e. light intensity multiplied by the interval $t_s$-$t_o$, remains constant as the light intensity varies if the photoconductive layer 13 has a resistance, $R_{pc}$, which is inversely proportional to the light intensity. For a desired amount of exposure light, localized light intensity can be readily calculated, once $t_s$-$t_o$ is measured. Furthermore, it should be clear to those skilled in the art that a desired exposure level may be varied by changing the capacitance of the junction 17, the applied voltage V or the capacitance formed by the photoconductive layer 13.

Because the elements 11 are electrically in parallel with each other, the total current ($I_t$) drawn by the device 10 is the sum of the element currents. Accordingly, an increase in $I_t$ occurs when a diode 12 for one of the elements 11 switches on. The first such increase in $I_t$ results from whichever element 11 is illuminated by the brightest light and occurs when the light integrated over time at that element reaches a desired level of exposure. By monitoring the intervals $t_s$-$t_o$ for all the elements 11, a statistical distribution of localized intensities of an entire scene can be monitored.

From the above disclosure, it will be obvious to those skilled in the art that the elements 11 of the device 10 can be integrated within a single integrated circuit chip, to form a unitary structure for detecting localized light conditions with high resolution.

Figure 4:
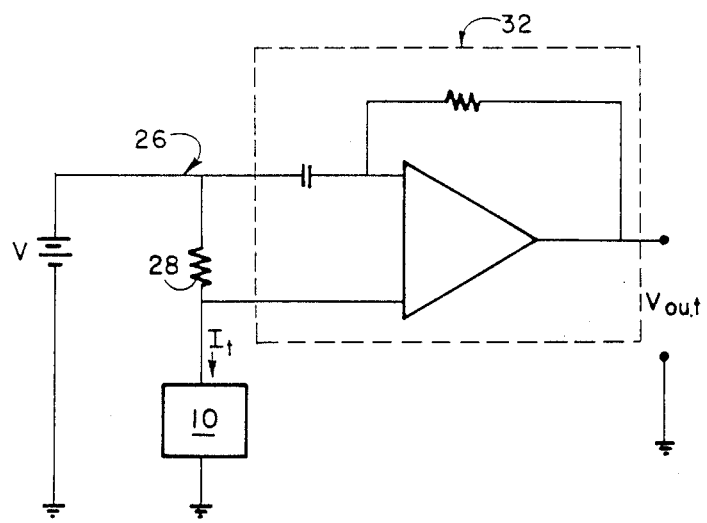
FIG. 4 is a schematic illustration of a signal detection circuit for use with the light sensing device of FIG. 1.

A circuit 26 for detecting changes in the current through the device 10 is shown partially in block form in FIG. 4. A particular advantage of the circuit 26 is that it is formed of electrical components that may be readily fabricated in integrated circuit form, for incorporation on a single chip with the device 10.

A current sensing resistor 28 is serially connected between the device 10 and its voltage source V. The resistor 28 is also connected across the input terminals of an operational amplifier circuit 32, which is arranged as a differentiator. Thus, the output of the amplifier 32 is proportional to the rate of change of the voltage across the resistor 28. Therefore, when an increase in current $I_t$ occurs in response to the switching of an element 11, a corresponding output pulse is produced at the output of the amplifier 32.

The device 10 may be used as a light monitoring device in a camera for determining prior to an exposure whether any localized scene light intensity is above or below a given level. For example, the device 10 may be used to switch a camera automatically into a flash exposure mode when scene light intensity is low.

The device 10 may also be used in real time for the controlling of the closing of a camera shutter or the controlling of the quenching of an electronic flash apparatus, in photographic apparatus where exposure control is based on a statistical relationship between localized peak exposure and an optimum exposure of the entire scene.

Figure 5:
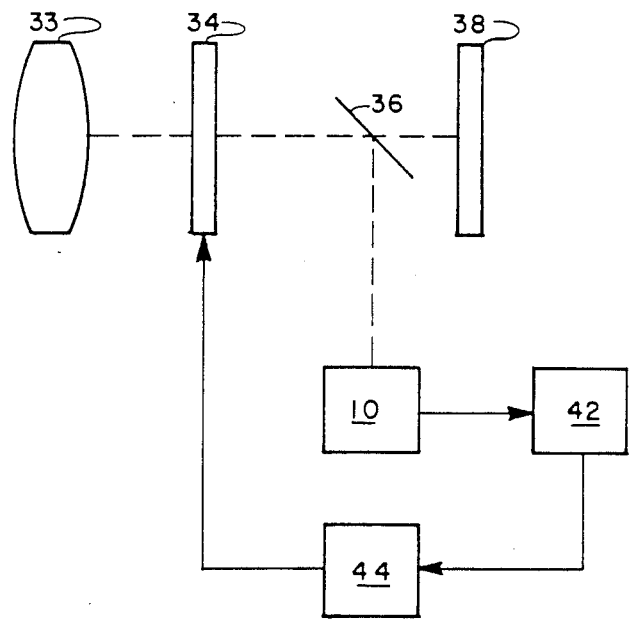
FIG. 5 is a block diagram of a camera embodying the light sensing device of the invention.

An example of the use of the device 10 in a camera in the latter mode is illustrated in FIG. 5. The camera includes a lens 33, a shutter 34, a semi-reflective mirror 36, and an image recording medium 38 such as photographic film. The opening of the shutter 34 is controlled by a conventional electronic shutter control mechanism 44 found in many cameras. The semi-reflective mirror 36 diverts a portion of the reflected scene light to the light sensing device 10. When a desired peak exposure is reached, an increase in the device current is detected by a detector circuit 42 of a type such as shown in FIG. 4. Detector circuit 42 outputs a signal to the shutter control mechanism 44 which then closes the shutter 34 to terminate the exposure.

The invention has been described in detail with particular reference to a preferred embodiment thereof, but it will be understood that variations and modifications can be effected within the spirit and scope of the invention. For example, it would be apparent to those skilled in the art that other structures are possible, such as P-type regions nested in an N-type substrate, or N-type regions in a P-type epitaxial layer.

What is claimed is:

1. A light sensing device for detecting localized exposure conditions, said device comprising:
    (a) a semiconductive substrate including a PN junction defining a junction diode having a predetermined reverse breakdown voltage and a capacitance that is functionally related to said junction;
    (b) a layer of photoconductive material interposed between an electrode of said diode and a transparent electrode, to define a capacitive element, serially connected to said diode, having a capacitance that is functionally related to the thickness of said photoconductive layer;
    (c) means for applying a voltage aross to said PN junction and to said capacitive element, the voltage being divided in accordance with the respective capacitances of said junction and said capacitive element, the capacitances being selected such that charge is transferred from said photoconductive material to said junction, in response to the impinging of light on said photoconductive material, until the amount of charge accumulated at said junction produces a voltage corresponding to the predetermined breakdown voltage of said diode; and
    (d) detector means, responsive to the charging of the PN junction reaching the diode reverse breakdown voltage, for producing an output signal indicating that a predetermined amount of light has impinged on said photoconductive layer.

2. A light sensing device as claimed in claim 1 including a semiconductive region of one conductivity type nested within a semiconductive region of a second conductivity type, for defining said PN junction extending to a surface of said substrate.

3. A light sensing device as claimed in claim 1 wherein said means for applying a voltage across said PN junction and said capacitive element includes means for connecting a voltage source across said substrate and said photoconductive layer.

4. A light sensing device as claimed in claim 3 including adjustment means, electrically connected to said means for applying a voltage, for varying the amount of voltage applied to said PN junction and said capacitive element.

5. A camera having a light sensing device for detecting localized intensity of light reflected from a scene, said light sensing device comprising:
    (a) a semiconductor substrate of one conductivity type having an array of semiconductor regions of a second conductivity type integrated within a surface of said substrate for forming a corresponding array of PN junctions integrated within said substrate, each of said PN junctions defining a junction diode having a predetermined reverse breakdown voltage and a capacitance that is functionally related to its corresponding junction;
    (b) an array of electrically conductive terminals each of which is in contact with a different one of said semiconductor regions of said second conductivity type;
    (c) a layer of photoconductive material overlaying said array of conductive terminals;
    (d) a layer of transparent electrically conductive material overlaying said layer of photoconductive material, said array of conductive terminals, said photoconductive material and said transparent material forming an array of capacitive elements each of which is serially connected to the corresponding diode of said PN junction array and each of said elements having a capacitance corresponding to the thickness of the associated portion of said photoconductive material;
    (e) means for applying a voltage across said array of capacitive elements and said array of PN junctions to reverse bias said junctions, the voltage being divided in accordance with the capacitance of said PN junctions and the capacitance of corresponding portions of said photoconductive material, the capacitance of said array of said capacitive elements and the capacitance of said PN juntions being selected so that charge is transferred from said photoconductive layer to said corresponding PN junctions in accordance with the intensity of localized light impinging on corresponding portions of said photoconductive material, such transfer of charge being effected until the amount of charge accumulated at said corresponding PN junction produces a voltage that is equal to the predetermined breakdown voltage of said corresponding diode; and
    (f) detector means, responsive to the charging of a PN junction reaching the diode reverse breakdown voltage, for producing an output signal indicating that a predetermined amount of localized light has impinged on a corresponding portion of said photoconductive material.

* * * * *